(12) United States Patent
Haufe et al.

(10) Patent No.: US 6,913,987 B2
(45) Date of Patent: Jul. 5, 2005

(54) METHOD FOR FABRICATING SELF-ALIGNED CONTACT CONNECTIONS ON BURIED BIT LINES

(75) Inventors: Juerg Haufe, Dresden (DE); Josef Willer, Riemerling (DE)

(73) Assignees: Infineon Technologies AG, Munich (DE); Infineon Technologies Flash GmbH & Co. KG, Dresden (DE)

( * ) Notice: Subject to any disclaimer, the term of this patent is extended or adjusted under 35 U.S.C. 154(b) by 17 days.

(21) Appl. No.: 10/728,388

(22) Filed: Dec. 5, 2003

(65) Prior Publication Data

US 2004/0115912 A1 Jun. 17, 2004

(30) Foreign Application Priority Data

Dec. 5, 2002 (DE) .......................... 102 56 936

(51) Int. Cl.[7] .......................................... H01L 21/3205
(52) U.S. Cl. ...................... 438/586; 438/738; 438/739; 438/595
(58) Field of Search ................................ 438/585, 586, 438/595, 735, 737, 738, 739

(56) References Cited

U.S. PATENT DOCUMENTS

| 5,966,602 A | * | 10/1999 | Kawazu et al. ............. 438/258 |
| 6,218,275 B1 | | 4/2001 | Huang et al. |
| 6,235,621 B1 | * | 5/2001 | Jeng et al. .................. 438/592 |
| 6,344,692 B1 | | 2/2002 | Ikemasu et al. |
| 2002/0001936 A1 | | 1/2002 | Terauchi et al. |
| 2002/0024093 A1 | | 2/2002 | Ahn et al. |
| 2002/0117698 A1 | | 8/2002 | Inumiya et al. |

FOREIGN PATENT DOCUMENTS

| DE | 101 41 301 A1 | 5/2002 |
| WO | 99/17360 A1 | 4/1999 |
| WO | 01/43176 A1 | 6/2001 |

* cited by examiner

Primary Examiner—Brad Smith
(74) Attorney, Agent, or Firm—Laurence A. Greenberg; Werner H. Stemer; Ralph E. Locher

(57) ABSTRACT

Word lines of a semiconductor component are provided with an encapsulation of dielectric material, Spacers of oxide extend alongside at the sidewalls of the word lines. The spacers are subsequently covered together with the word lines with a nitride layer. Borophosporosilicate glass is introduced between those portions of the nitride layer which respectively belong to a word line and is removed selectively with respect to the nitride using a mask. Contact hole fillings for the electrical connection of the buried bit lines are introduced into the contact holes thus formed.

4 Claims, 5 Drawing Sheets

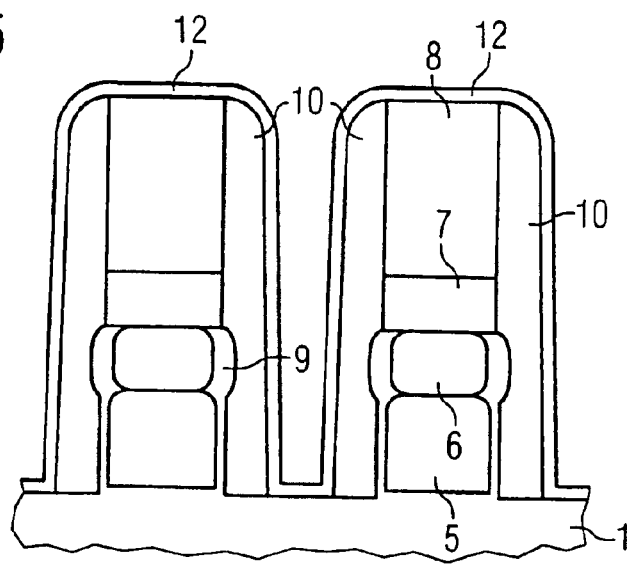
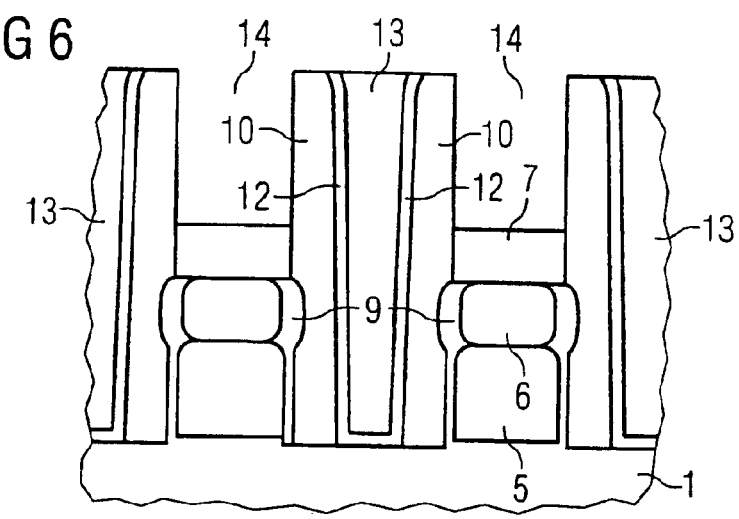
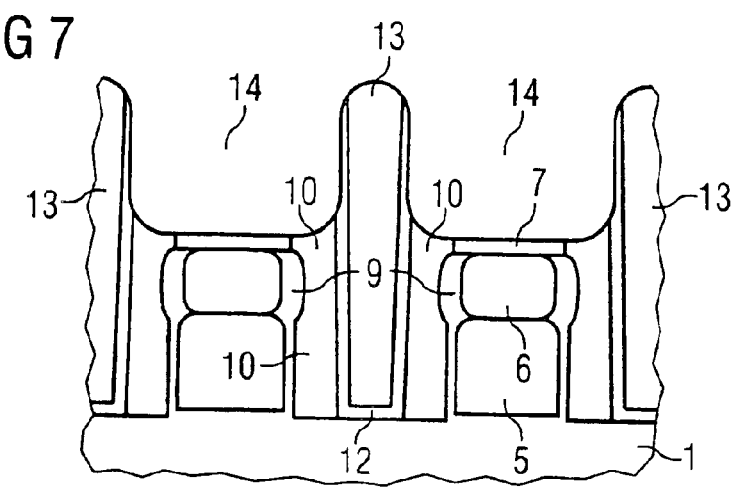

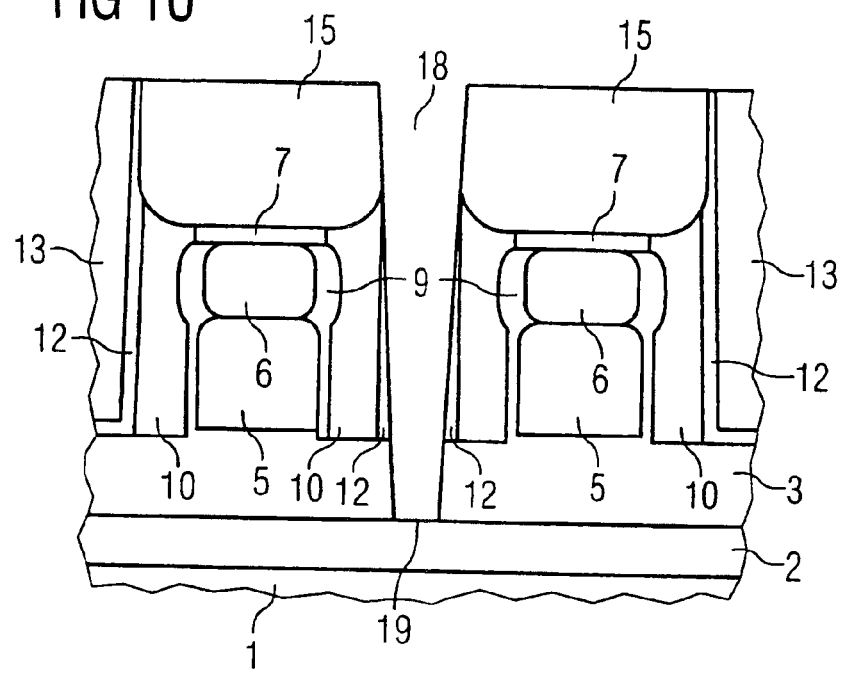
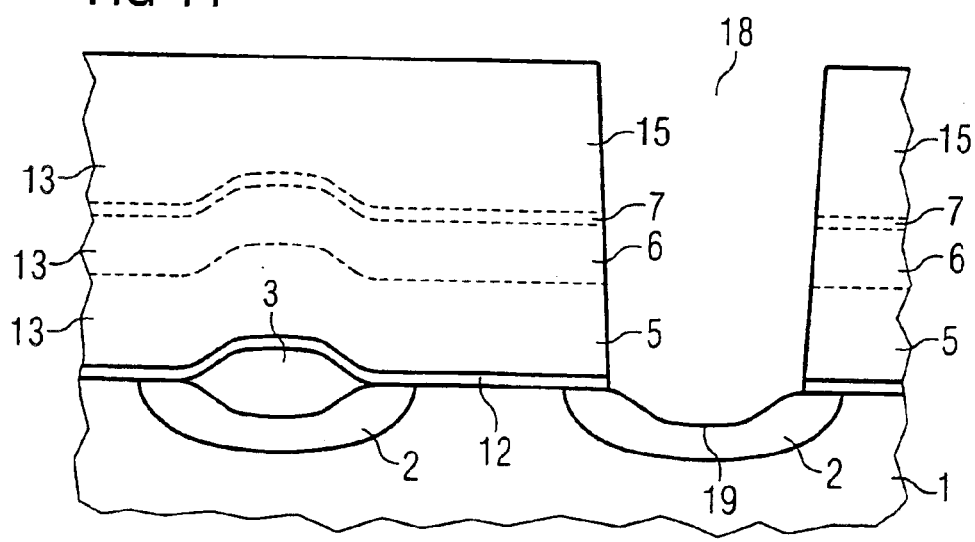

METHOD FOR FABRICATING SELF-ALIGNED CONTACT CONNECTIONS ON BURIED BIT LINES

BACKGROUND OF THE INVENTION

Field of the Invention

The invention lies in the semiconductor technology field. More specifically, the present invention relates to a method for fabricating contact connections on buried bit lines between encapsulated word lines of a semiconductor memory cell array.

In semiconductor memories, the memory cells are formed in a matrix arrangement at the top side of a semiconductor body or substrate. The cells are addressed by strip-type bit lines arranged parallel at a distance from one another and word lines which run transversely with respect to the bit lines and likewise run parallel at a distance from one another. The bit lines may be fabricated as so-called buried bit lines by introducing dopant into the semiconductor material. The word lines are web-like connections on the top side of the semiconductor body or substrate.

In order to reduce the electrical resistance, the bit lines are contact-connected at regular intervals and connected to a wiring running on the top side. These contact connections are disposed between the word lines in the region between two respective source/drain regions of the memory transistors.

The problem of an inadequate electrical insulation of the contact connections with respect to the word lines in conjunction with low coupling capacitance arises in this case. This difficulty is becoming increasingly apparent with an increasing miniaturization of the semiconductor memories. In the prior art, the web-type word lines have usually been enveloped in a nitride of the semiconductor material and thus encapsulated.

SUMMARY OF THE INVENTION

It is accordingly an object of the invention to provide a method of fabricating self-aligned contact connections on buried bit lines between encapsulated word lines which overcomes the above-mentioned disadvantages of the heretofore-known devices and methods of this general type and which renders it possible to achieve an improved electrical insulation and a lower coupling capacitance.

With the foregoing and other objects in view there is provided, in accordance with the invention, a manufacturing process for forming a bit line contact in a semiconductor component. The semiconductor component has:
 a substrate with a surface, bit lines formed in the surface of the substrate by introduction of dopant, and strip-type word lines formed on the surface of the substrate;
 the word lines extending parallel to one another and transversely with respect to the bit lines, forming gate electrodes in each case between the bit lines, and having an insulation layer of silicon oxide and a silicon nitride cover layer disposed thereon; and
 spacers of silicon oxide disposed alongside at sidewalls of the word lines.

The novel method is directed to fabricating self-aligned contacts to the bit lines. The method comprises:
 forming a silicon nitride layer on the spacers and on the cover layer and filling spaces between the word lines with a filling;
 leveling the filling and thereby uncovering the silicon nitride layers on the word lines during leveling of the filling and removing the silicon nitride layers by etching selectively with respect to the silicon oxide layers to form openings;
 subsequently expanding the openings laterally by etching the silicon oxide layers selectively with respect to residual portions of the silicon nitride layer on the spacers; and
 subsequently filling the holes with silicon nitride to form coverings of silicon nitride projecting laterally above the word lines.

In accordance with an added feature of the invention, a storage layer sequence for charge trapping of hot electrons is fabricated from a respective channel region for serving as a storage layer.

In accordance with another feature of the invention, the spaces between the word lines are filled with borophosphoro-silicate glass.

In accordance with a concomitant feature of the invention, the word lines comprise silicon-containing material, and the method further comprises, prior to fabricating the spacers of oxide, oxidizing a material of the word lines to form an oxide layer encapsulating the word lines.

In other words, in the fabrication method according to the invention, the word lines are provided with an encapsulation made of dielectric material, which comprises spacers made of oxide arranged at least alongside at the sidewalls of the word lines, which spacers are subsequently covered together with the word lines with a nitride layer. A filling of the interspaces present, e.g. with borophosphorosilicate glass (BPSG), is introduced between those portions of the nitride layer which respectively belong to a word line and is removed selectively with respect to the nitride in regions using a mask. Contact hole fillings for the electrical connection of the buried bit lines are introduced into the openings thus formed.

The nitride layer on the top sides of the word lines can be fabricated dimensionally accurately with respect to the edges of the spacers with very narrow interspaces if a strip-type nitride layer is alternatively provided on the word lines before the fabrication of the spacers made of oxide. The spacers are also fabricated at the sidewalls of this alternatively applied nitride layer. The alternatively applied nitride layer is then removed selectively with respect to the oxide of the spacers. The openings between the spacers that are formed in this way in each case above the word lines are expanded in a manner projecting laterally above the sidewalls of the word lines by removing the upper portions of the spacers from the side of the openings. For this purpose, it is expedient if the spacers have been covered beforehand with a thin layer of nitride, a nitride liner, so that the removal of the upper portions of the spacers ends in each case selectively at these nitride layers and the filling of the interspaces between the word lines is not removed. The expanded openings are subsequently filled with nitride.

Other features which are considered as characteristic for the invention are set forth in the appended claims.

Although the invention is illustrated and described herein as embodied in a method for fabricating self-aligned contact connections on buried bit lines, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3–8 are cross sections similar to that of FIG. 1, through a detail of the semiconductor memory cell array transversely with respect to the word lines after different steps of the fabrication method;

FIG. 10 is a cross section similar to that of FIGS. 3–8; and

FIG. 11 is a cross section similar to that of FIG. 9.

DESCRIPTION OF THE PREFERRED EMBODIMENTS

Figure 1:
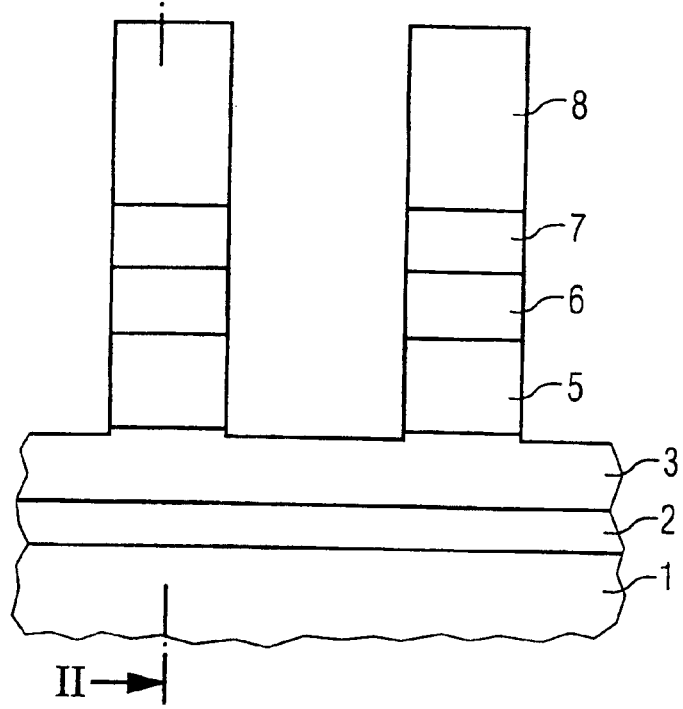
FIG. 1 is a section, taken along the line I—I in FIG. 2, through a detail of the semiconductor memory cell array transversely with respect to the word lines after a first set of fabrication steps of the fabrication method according to the invention.

Referring now to the figures of the drawing in detail and first, particularly, to FIG. 1 thereof, there is shown a cross section through a semiconductor body 1 with buried bit lines 2 formed therein. The bit lines 2 are covered by bit line insulations 3 on the top side. The bit line insulations may be fabricated, for instance, by oxidation of the semiconductor material. The word lines are formed as webs on the top side. The webs are arranged parallel to one another at a distance from one another.

The actual word line 5, by way of example, is polysilicon doped sufficiently highly for electrical conductivity. In order to reduce the electrical bulk resistance, a further word line layer 6, which may be tungsten silicide, may be applied thereon. This is followed by an insulation layer 7 made of dielectric material, preferably an $SiO_2$ layer having a thickness of typically about 50 nm. The topmost layer is a silicon nitride layer 8 having a thickness of typically about 150 nm.

Figure 2:
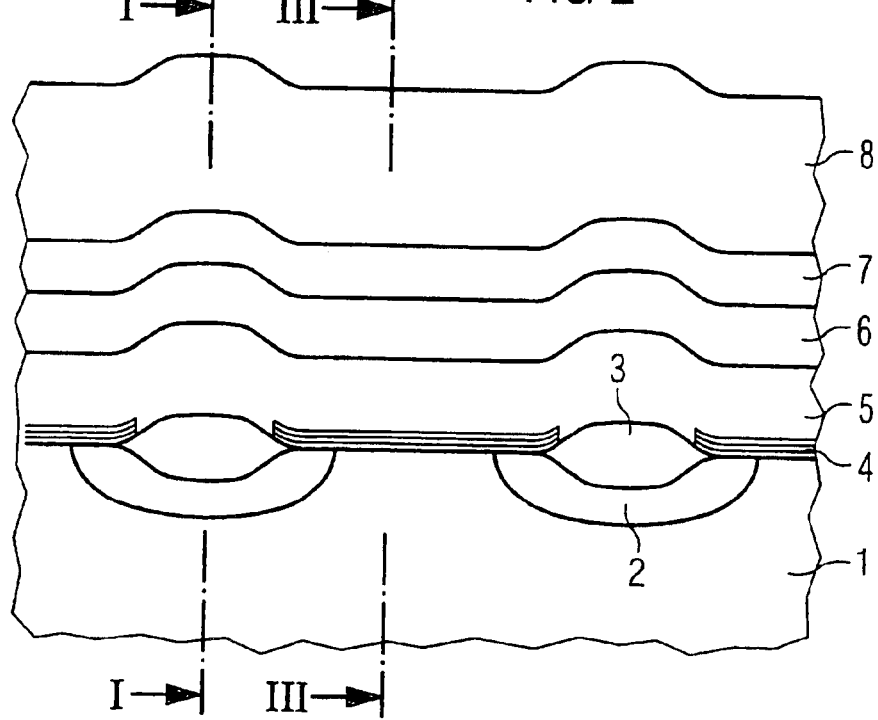
FIG. 2 is a cross section, along the line II—II in FIG. 1, transversely with respect to the bit lines, through a detail of the semiconductor memory cell array.

FIG. 2 illustrates the cross section transversely with respect to the bit lines that is marked in FIG. 1. On the semiconductor body 1, portions of a storage layer 4 are situated between the bit line insulations 3, which storage layer may be formed in particular as a storage layer sequence for programming by means of charge trapping of hot electrons from the channel, e.g. as an oxide-nitride-oxide storage layer sequence. The word line 5, the further word line layer 6, the insulation layer 7 and the silicon nitride layer 8 in accordance with FIG. 1 are sectioned in the longitudinal direction of the word line webs in FIG. 2. The cross section of FIG. 1 is marked in FIG. 2.

Figure 3:
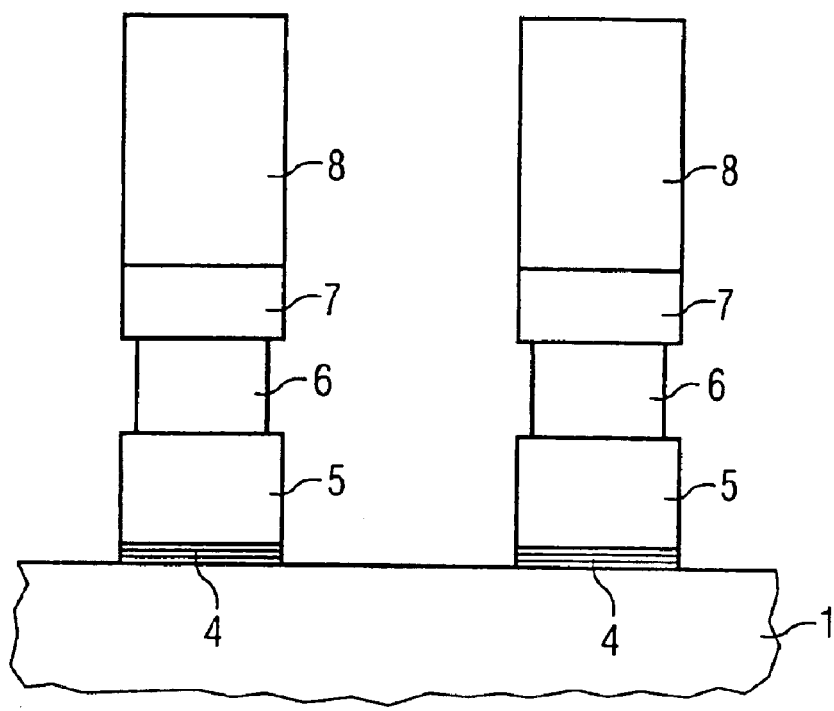

A further cross section is marked in FIG. 2 and is illustrated in FIG. 3. Here it is possible to discern the portions of the storage layer 4 in each case between the word line 5 and the semiconductor body 1. In this exemplary embodiment, the portions of the storage layer 4 are in each case etched back to the region of the word line webs. However, the storage layer 4 may also be present between the word lines outside the regions of the bit line insulations 3. The further word line layer 6 is laterally etched back slightly by means of a pull-back etching in accordance with the illustration of FIG. 3, so that approximately planar sidewalls of the word line webs are produced on account of the volume enlargement by means of a subsequent oxidation of the material.

Figure 4:
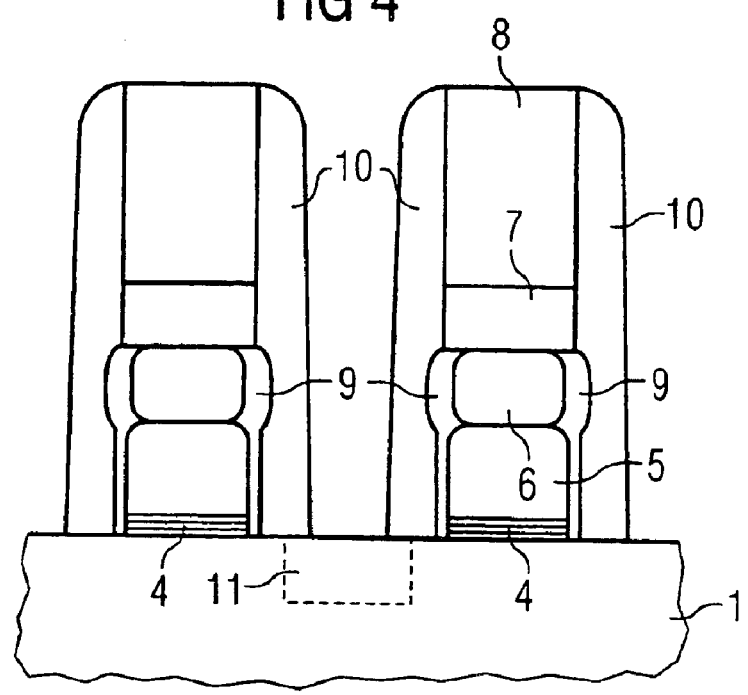

FIG. 4 illustrates the structure after the oxidation of the word line layers 5, 6 to form oxide layers 9, which encapsulate the word lines, and the provision of lateral spacers 10. The spacers 10 are made of oxide and are fabricated by whole-area conformal deposition of an oxide layer and subsequent anisotropic etching-back of the oxide. In accordance with a preferred embodiment of the method, the top side of the structure illustrated in FIG. 4 is coated with a thin nitride layer (nitride liner 12), as is depicted in FIG. 5.

Before or after the application of the nitride layer, it is possible, in accordance with FIG. 4, to introduce an insulation implantation between the bit lines into the semiconductor material of the semiconductor body 1, thereby fabricating the insulation regions 11. These insulation regions 11 improve the insulation between the individual memory cells.

The illustration in FIG. 6 shows that next a filling 13 is introduced into the interspaces between the word lines, whereupon the top side is planarized. The filling 13 is a material which can be etched selectively with respect to silicon nitride. BPSG, for example, may be used here. After the planarization of the surface, the alternatively applied nitride layers 8 are removed, thereby forming the openings 14 along the word lines as depicted in FIG. 6.

By etching the material of the insulation layer 7 and the spacers 10, the openings 14 are expanded in the manner illustrated in FIG. 7. The nitride liner 12 serves as an etching stop layer in this case. The extended openings 14 are then filled with coverings 15 made of nitride, which project above the word lines laterally above the spacers.

Figure 8:
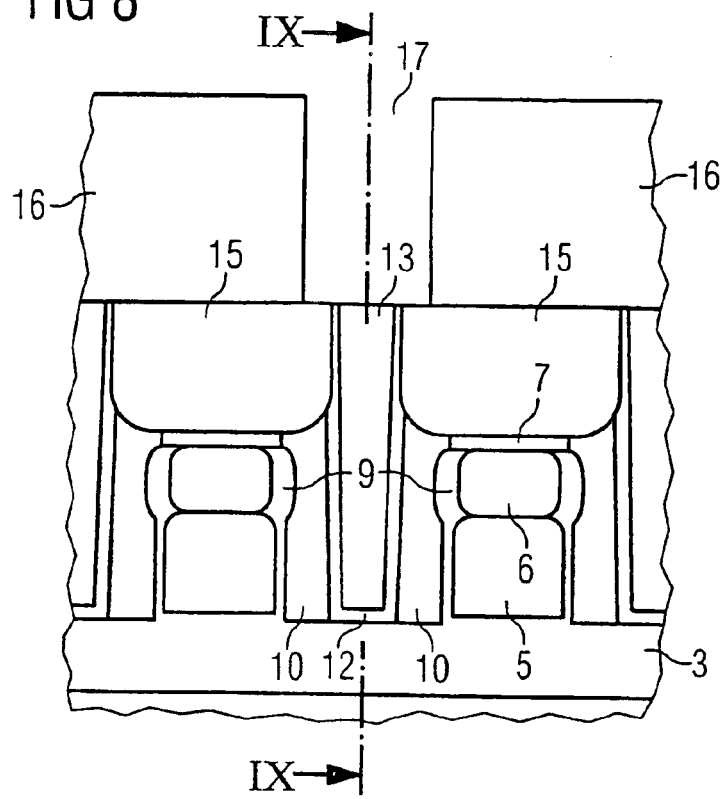

It then suffices for the etching-out of the contact holes, in accordance with the cross section of FIG. 8, to apply a mask 16 having openings 17 in the region of the contact connections to be fabricated, without the dimensional accuracy needing to be particularly good. In particular, it is not necessary for the opening 17 to be aligned precisely to the width of the contact holes.

Figure 9:
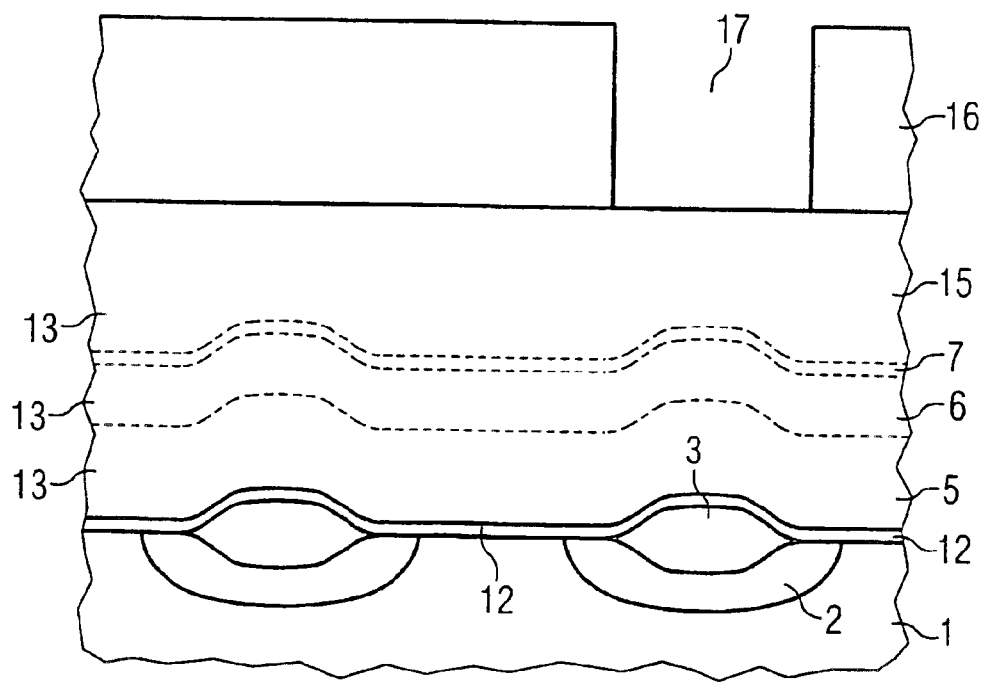
FIG. 9 is a cross section similar to that of FIG. 2 and taken along the line IX—IX in FIG. 8 transversely with respect to the bit lines after a further step of the fabrication method.

FIG. 9 illustrates the cross section marked in FIG. 8. In the region of the filling 13, the boundaries of the layers 5, 6, 7 and 15 are depicted by broken lines as concealed contours in FIG. 9. The reference symbols represented correspond to those of FIG. 8 and need not be explained in any more detail.

FIG. 10 shows the cross section in accordance with FIG. 8 after the contact holes 18 have been etched down to a top-side contact region 19 of the bit lines using the mask 16. FIG. 10 clearly reveals that the nitride layer 15 forms a lateral boundary of the contact holes 18. That is brought about by virtue of the fact that the filling 13 was introduced from a material which can be etched selectively with respect to the nitride of the coverings 15. The oxide of the spacers 10 is preserved owing to the anisotropy of the etching process and the protection by the nitride liner 12, which may have been completely removed following the etching process.

FIG. 11 shows the cross section corresponding to FIG. 9 after this etching step. The contact holes 18 may then be provided with contact hole fillings in a manner known per se by introducing e.g. tungsten conductively doped polysilicon or the like into the openings. The contact hole fillings may then be connected to interconnects on the top side. The subsequent method steps correspond to the method steps that are otherwise known from the fabrication of semiconductor memories.

We claim:

1. In a manufacturing process for a memory cell array of a semiconductor component, the component having:

a substrate with a surface, bit lines formed in the surface of the substrate by introduction of dopant, and strip-type word lines formed on the surface of the substrate;

the word lines extending parallel to one another and transversely with respect to the bit lines, forming gate electrodes in each case between the bit lines, and having an insulation layer of silicon oxide and a silicon nitride cover layer disposed thereon; and spacers of silicon oxide disposed alongside at sidewalls of the word lines;

a method for fabricating self-aligned contacts to the bit lines, the method which comprises:

forming a silicon nitride layer on the spacers and on the cover layer and filling spaces between the word lines with a filling;

leveling the filling and thereby uncovering the silicon nitride layers on the word lines during leveling of the filling and removing the silicon nitride layers by etching selectively with respect to the silicon oxide layers to form openings;

subsequently expanding the openings laterally by etching the silicon oxide layers selectively with respect to residual portions of the silicon nitride layer on the spacers; and subsequently filling the holes with silicon nitride to form coverings of silicon nitride projecting laterally above the word lines.

2. The method according to claim 1, which comprises fabricating a storage layer sequence for charge trapping of hot electrons from a respective channel region and for serving as a storage layer.

3. The method according to claim 1, which comprises filling the spaces between the word lines with borophosphoro-silicate glass.

4. The method according to claim 3, wherein the word lines comprise silicon-containing material, and the method further comprises, prior to fabricating the spacers of oxide, oxidizing a material of the word lines to form an oxide layer encapsulating the word lines.

* * * * *